United States Patent [19]

Veenstra

[11] Patent Number: 4,677,318
[45] Date of Patent: Jun. 30, 1987

[54] PROGRAMMABLE LOGIC STORAGE ELEMENT FOR PROGRAMMABLE LOGIC DEVICES

[75] Inventor: Kerry S. Veenstra, Concord, Calif.

[73] Assignee: Altera Corporation, Santa Clara, Calif.

[21] Appl. No.: 722,684

[22] Filed: Apr. 12, 1985

[51] Int. Cl.⁴ .......................................... H03K 19/177
[52] U.S. Cl. ................... 307/465; 307/445; 364/716
[58] Field of Search ............... 307/440, 445, 465; 364/716

[56] References Cited

U.S. PATENT DOCUMENTS

| 4,034,356 | 7/1977 | Howley et al. | 307/465 |
| 4,422,072 | 12/1983 | Cavlan | 307/465 X |
| 4,433,331 | 2/1984 | Kollaritsch | 364/716 X |
| 4,525,641 | 6/1985 | Cruz et al. | 307/465 |

OTHER PUBLICATIONS

Elliott et al., "Array Logic Processing"; *IBM-TDB;* vol. 16, No. 2, pp. 586-587; 7/1973.
Eggebrecht et al., "Programmable Logic Array with Provision for Interrupts"; *IBM-TDB;* vol. 20, No. 2, pp. 745-746; 7/1977.
Andres, "MOS Programmable Logic Arrays", A Texas Instruments Application Report; No. CA-158, 10/1970.

*Primary Examiner*—Stanley D. Miller
*Assistant Examiner*—D. R. Hudspeth
*Attorney, Agent, or Firm*—Claude A. S. Hamrick

[57] ABSTRACT

A storage element for use in a logic array including a flip-flop device and a complex logic circuit interconnected in such a way that the output of the complex logic circuit is an input to the flip-flop. A Toggle Flip-Flop Control (TFFC) signal, an invert control (INV) signal, and a clock (CLK) signal are also inputs to the complex logic circuit. The output of the flip-flop connects to an output pad, an internal direct feedback line which is one of the means by which the flip-flop is connected to the comples logic circuit, and an external feedback bus which leads back to an associated AND-OR array. The inptu to the complex logic circuit is generated by the standard AND-OR array which is programmable to some degree.

15 Claims, 18 Drawing Figures

PROGRAMMABLE LOGIC STORAGE ELEMENT FOR PROGRAMMABLE LOGIC DEVICES

BACKGROUND OF THE INVENTION

1. Field of the Invention

The present invention relates generally to programmable logic array devices, and more specifically, to logic storage element architecture which permits the selective implementation of a number of different types of logic storage functions from a storage element circuit including a basic flip-flop element.

2. Description of the Prior Art

Programmable logic arrays and similar circuit elements such as programmable array logic devices have been in existence for many years. For the most part, these devices are built using an architecture which consists of an AND array in combination with an OR-arry. This combined array is in turn connected to an arbitrary number of storage elements, usually consisting of D-type flip-flops or, less frequently, JK-type flip-flops, with the outputs of these flip-flops being fed back to the input array. The output pins of such devices may be connected to either or both of the storage elements and the array. Such architecture, which is the design most commonly found in user-programmable logic devices of the type including the present invention, permits the relatively straightforward implementation of synchronous state machines, including counters and certain types of controllers.

Two main implementations of this type of architecture have appeared in recent years. The first involves the use of a D-type flip-flop whose inputs consist of an input from the OR array and a clock pulse, with both of these inputs being connected directly to the flip-flop itself. Such design has been improved upon by a routing of the signal from the OR array into an exclusive-OR gate which has an invert signal as its second input. This exclusive-OR gate's output is then routed to the D input of a D-type flip-flop and the clock pulse provides the second input. In both architectures, the output of the flip-flop is normally routed both to the output pads of the device itself and to a feedback bus which reconnects it to the AND array.

The first design mentioned above, involving the direct connection of the input signal from the OR array into the flip-flop, has an important and troublesome restriction; namely, the logical expressions which form the input to such devices must be represented in the "sum-of-products" form so that they can be implemented in the AND-OR array. This requirement results in highly inefficient representations of some logical expressions, with the attendant problem of a proliferation of signal lines in the AND array. For example, if the flip-flop in question were to be logically driven by the equation:

$$f = A \oplus B \oplus C,$$

where $\oplus$ is the exclusive-OR operator, four lines in the AND array would be required. This is because the right side of the above equation, translated into the sum-of-products form, becomes:

$$f = ABC + A'B'C + A'BC' + AB'C',$$

where the prime indicator (as in A') indicates the inverse of the signal preceding it and ABC is the product (or logical AND) of inputs A, B and C.

This proliferation of AND array signals becomes quite problematic when some classes of expression are required as inputs to the flip-flop. For example, if the input desired is represented by the equation:

$$g = (A+B+C)(D+E+F)(G+H+I),$$

the expanded equation using the sum-of-products method produces 27 product terms, meaning that 27 lines will be required in the AND array; an inefficiently high number for a single input factor. The 27 product terms for the above equation in sum-of-products equivalent form are:

$$g = ADG + ADH + ADI + AEG + AEH + AEI + AFG + AFH + AFI$$

$$+ BDG + BDH + BDI + BEG + BEH + BEI + BFG + BFH + BFI$$

$$+ CDG + CDH + CDI + CEG + CEH + CEI + CFG + CFH + CFI$$

Some manufacturers have overcome this limitation of AND-OR arrays by introducing programmable inverters between the OR array and the storage element. In such embodiments, each programmable inverter is in turn composed of an exclusive-OR gate and an inversion control input supplied by a programmable fuse, or a bit from an EPROM, EEPROM, RAM or other logic-level storage device. As a result of the use of such programmable inverters, complex logic expressions which would otherwise generate an unacceptably large number of product terms ("p-terms") in the sum-of-products method described earlier, generate a manageable number when they are inverted. For example, the equation above, which generated 27 p-terms in its uninverted form, generates only three-terms when inverted; namely, $$g' = A'B'C' + D'E'F' + G'H'I'.$$

Clearly, this approach represents a significant improvement over the older methods of programmable logic device architecture. There remain, however, certain types of expressions which will require a large number of p-terms regardless of whether they are expressed in non-inverted or inverted form. A classic example of such an expression is one widely used in defining synchronous binary counter circuits; i.e., $$D4 = (Q1Q2Q3) \oplus Q4,$$

where D4 is applied to the input of a storage element, and Q4 is that element's output (also referred to as its "register feedback"). As the following two equations show, this expression generates four p-terms whether it is inverted or not:

$$D4 = Q1Q2Q3Q4' + Q1'Q4 + Q2'Q4 + Q3'Q4$$

$$D4' = Q1Q2Q3Q4 + Q1'Q4' + Q2'Q4' + Q3'Q4'$$

Obviously, such equations are not implemented more efficiently using the programmable inverter approach to programmable logic architecture described above.

SUMMARY OF THE PRESENT INVENTION

It is therefore an object of the present invention to provide an improved method and apparatus by which the results of certain classes of complex logic expressions may be implemented in conjunction with and applied as inputs to flip-flop circuits, either along or in combination with associated AND-OR arrays, to emulate other types of flip-flop circuits.

Another object of the present invention is to provide a novel logic storage element which can be used to emulate flip-flop functions of the JK, RS, D or T types.

It is a further object of the present invention to provide an improved programmable logic device including a basic flip-flop element which may be selectively caused to emulate a JK-type, RS-type, D-type or T-type logic storage device, including or inhibiting inversion on any or both inputs to the two-input type flip-flops or to the single input on a one-input type flip-flop.

Briefly, a preferred embodiment of a storage element in accordance with the invention includes a flip-flop device and a complex logic circuit interconnected in such a way that the output of the complex logic circuit is an input to the flip-flop. A Toggle Flip-Flop Control (TFFC), an invert control (INV) signal, and a clock (CLK) signal are also inputs to the complex logic circuit. The output of the flip-flop connects to an output pad, an internal direct feedback line which is one of the means by which the flip-flop is connected to the complex logic circuit, and an external feedback bus which leads back to an associated AND-OR array. The input to the complex logic circuit is generated by the standard AND-OR array which is programmable to some degree.

It is an advantage of the present invention that it provides a way for programmable logic circuit designers to efficiently emulate complex flip-flop logic components using programmable and less extensive and expensive component parts than would be required using conventional design methods.

It is another advantage of the present invention that it enables implementation of a large class of complex logic expressions which would not otherwise be implementable in flip-flop circuits to be so implemented.

It is a further advantage of the present invention that it permits such programmable logic circuits to be interfaced to OR arrays which are in turn either fixed in nature or programmable in function and which are connected to one or more programmable AND arrays, thus permitting a great deal of design flexibility in the process of implementing systems incorporating such programmable logic.

These and other objects and advantages of the present invention will no doubt become apparent to those skilled in the art after having read the following detailed description of the preferred embodiments which are contained in and illustrated by the various drawing figures.

DETAILED DESCRIPTION OF THE PREFERRED EMBODIMENT

Figures 1, 2, 3:
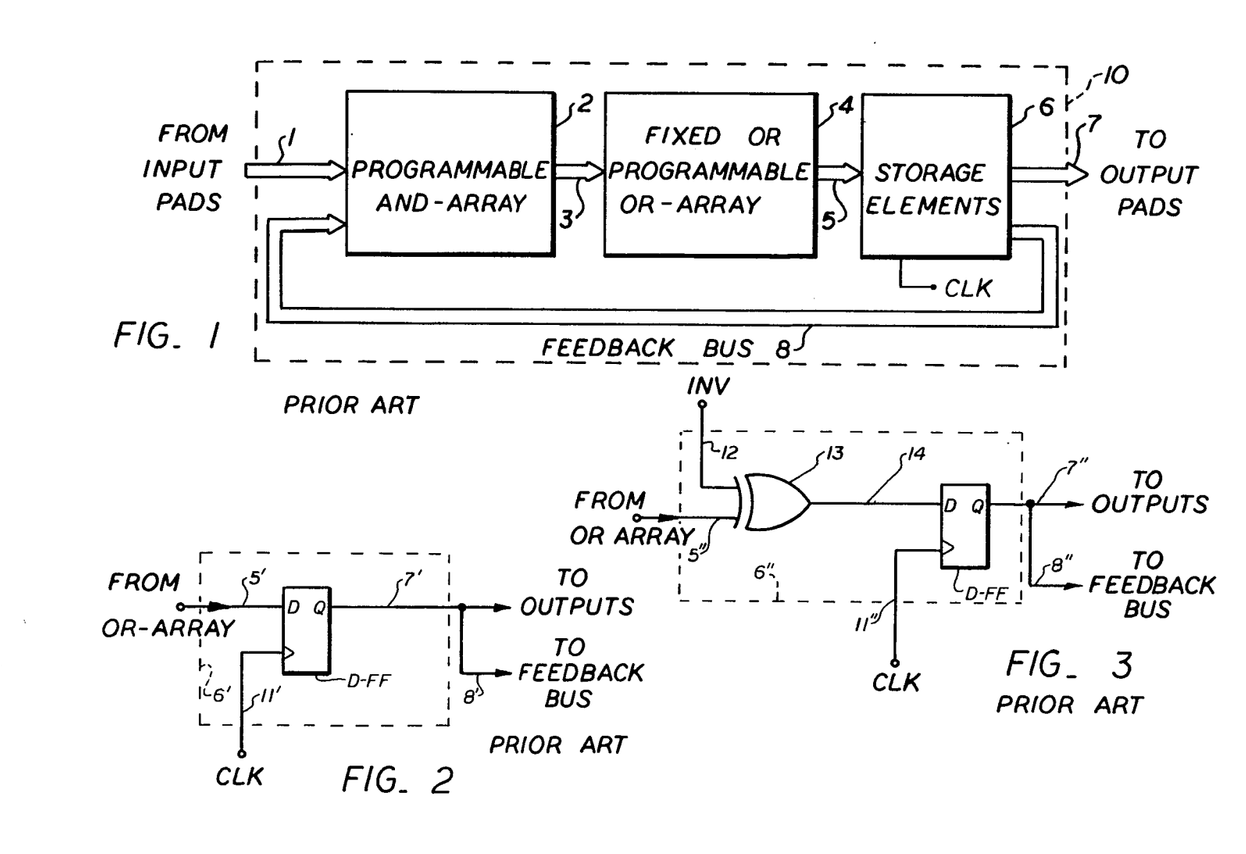
FIG. 1 is a generalized block diagram of prior art programmable logic devices including storage elements.
FIG. 2 is a schematic diagram of a typical prior art storage element.
FIG. 3 is a schematic diagram of a prior art D-type flip-flop storage element which incorporates a programmable inverter.

Referring to FIG. 1 of the drawing, a prior art programmable logic device 10 is shown to consist of three basic elements depicted by the blocks 2, 4 and 6. Logic signals enter the device from external input pads as shown at 1 and are fed into the programmable AND array 2 which in turn produces one or more signals to be passed via a product term bus 3 to the OR array 4 which may be either fixed or programmable. OR array 4 in turn generates one or more sumterm signals to be transmitted via the sum term bus 5 to one or more storage elements 6 of the device. In response to clock signals (CLK) input at 11, the output of storage elements 6 are fed to the output pads of the device over signal lines 7 and back to the inputs of the programmable AND array via Feedback Bus 8.

Referring to FIG. 2, as one prior art example of a storage element 6, a lead 5' from the sum term bus is shown connected to the flip-flop device itself, here depicted as a D-type flip-flop D-FF, but capable of being any type of flip-flop. A clock input (CLK) lead 11' provides the additional input to the flip-flop, the output Q of which is tied to the device output pads (not shown) over a line 7' and to the Feedback Bus over another line 8'. This is obviously the simplest embodiment used.

In FIG. 3, another prior art implementation of a storage element is shown at 6'', this implementation being somewhat programmable via an invert control input on line 12 which serves as one of two inputs to an exclusive-OR gate 13. The invert control signal (INV) is combined logically with the input on a line 5'' of the sum term bus from the OR array to produce an output on the logic line 14 which is routed to one input of the D flip-flop D-FF. The clock pulse signal input on line 11'' provides the second input to the storage device 6''. The output of the storage device 6'' is routed to the device output pads (not shown) over a signal line 7'' and to the Feedback Bus over another line 8''.

Figure 4:
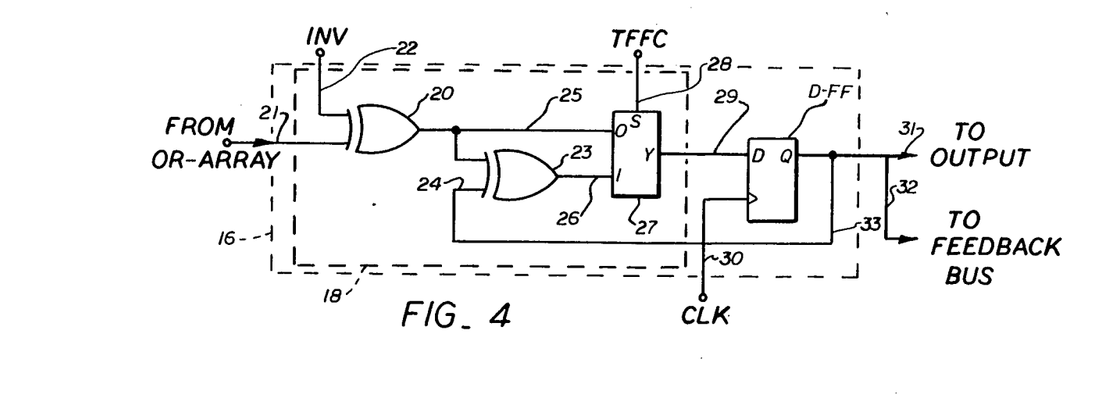
FIG. 4 is a schematic diagram showing an improved storage element in accordance with the present invention.

A first embodiment of an improved storage element in accordance with the present invention is shown in FIG. 4 of the drawing at 16 and includes a programmable control logic circuit 18 in combination with a D flip-flop D-FF. The device includes an exclusive-OR gate 20 which receives a data sumterm signal from the OR-array at its input 21 and an invert control signal (INV) at its input 22. A second exclusive-OR gate 23 accepts as inputs a feedback signal on line 24 and a split of the signal developed on line 25 by the exclusive-OR gate 20. Gate 23 produces an output on line 26 which provides one of three inputs to a multiplexer device 27. The other inputs to the multiplexer 27 includes the output furnished by the first exclusive-OR device 20 as a signal in line 25, and a Toggle Flip-Flop Control (TFFC) signal input on line 28. The multiplexer 27 in turn produces a signal in line 29 which is tied to the D input of the flip-flop D-FF. A next state logic clock signal (CLK) is input to D-FF at 30. Note that the output of flip-flop D-FF is connected to output pads via line 31, to the device feedback bus 8 by the lines 32, and to the input 24 of gate 23 by an internal feedback line 33. Operation of this embodiment will be described below.

Figure 5:
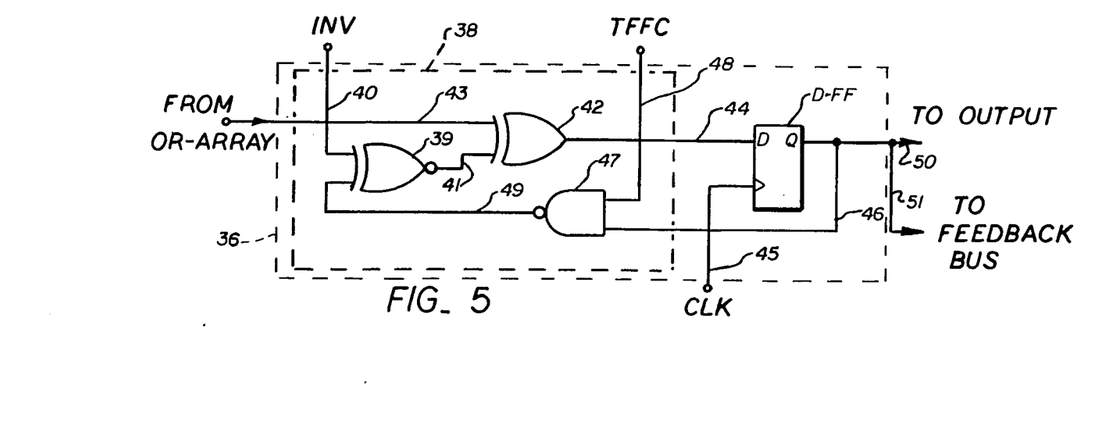
FIG. 5 is a schematic diagram showing an alternative embodiment of a storage element in accordance with the present invention.

FIG. 5 illustrates a storage device 36 including an alternative embodiment of the present invention utilizing a different form of programmable control logic circuit 38 in combination with a D flip-flop D-FF. In the circut 38, an exclusive NOR gate 39 accepts the invert signal (INV) input on line 40 as one of its inputs and produces a signal on line 41 which acts as one input to an exclusive-OR gate 42, the other input (sumterm) to gate 42 being on line 43 from the OR array. The exclusive-OR gate 42 in turn produces a next state logic signal on line 44 which serves as one input to the flip-flop D-FF, the other input being the clock signal input on line 45. The output of flip-flop D-FF is fed back to the circuit 38 via line 46 to one input of a NAND gate 47. This NAND gate, in turn, combines the feedback signal in line 46 with a TFFC signal input on line 48 to produce an output signal on line 49 which becomes the second input to the exclusive-NOR gate 39. The ouput of D-FF is also fed to output pads (not shown) via line 50 and to the device feedback bus via line 51.

Whereas the structure of two particular embodiments of the storage elements of the present invention have been described with reference to FIGS. 4 and 5, a more general statement of the invention is given by the following Table 1, a so called "next state diagram" in which the sixteen possible combinations of storage element parameters are set forth. Any combination of logic components which can satisfy these requirements is deemed to be within the scope of the present invention. To facilitate understanding of the table, a simplified single block diagram is also set forth.

TABLE 1

| Mode | TFFC | INV | SUMTERM | Q | Q+ |
|------|------|-----|---------|---|----|
| D    | 0    | 0   | 0       | 0 | 0  |
|      |      |     | 0       | 1 | 0  |
|      |      |     | 1       | 0 | 1  |
|      |      |     | 1       | 1 | 1  |
| ND   | 0    | 1   | 0       | 0 | 1  |
|      |      |     | 0       | 1 | 1  |
|      |      |     | 1       | 0 | 0  |
|      |      |     | 1       | 1 | 0  |
| T    | 1    | 0   | 0       | 0 | 0  |
|      |      |     | 0       | 1 | 1  |
|      |      |     | 1       | 0 | 1  |
|      |      |     | 1       | 1 | 0  |
| NT   | 1    | 1   | 0       | 0 | 1  |
|      |      |     | 0       | 1 | 0  |
|      |      |     | 1       | 0 | 0  |
|      |      |     | 1       | 1 | 1  |

TABLE 1-continued

MODE SELECT

As indicated by Table 1, the storage element of the present invention can be operated in four modes; namely, the D mode, the inverted D (ND) mode, the T mode, and the inverted T (NT) mode. These modes are selected by appropriate choice of the inputs TFFC and INV. Once a particular mode is selected, the next state signal "Q+" can be predicted for any particlar sumterm input (from the OR-array) and present state output Q.

FIGS. 6-9 illustrate various storage device types that may be emulated by the present invention and are further explained below.

Figure 10:
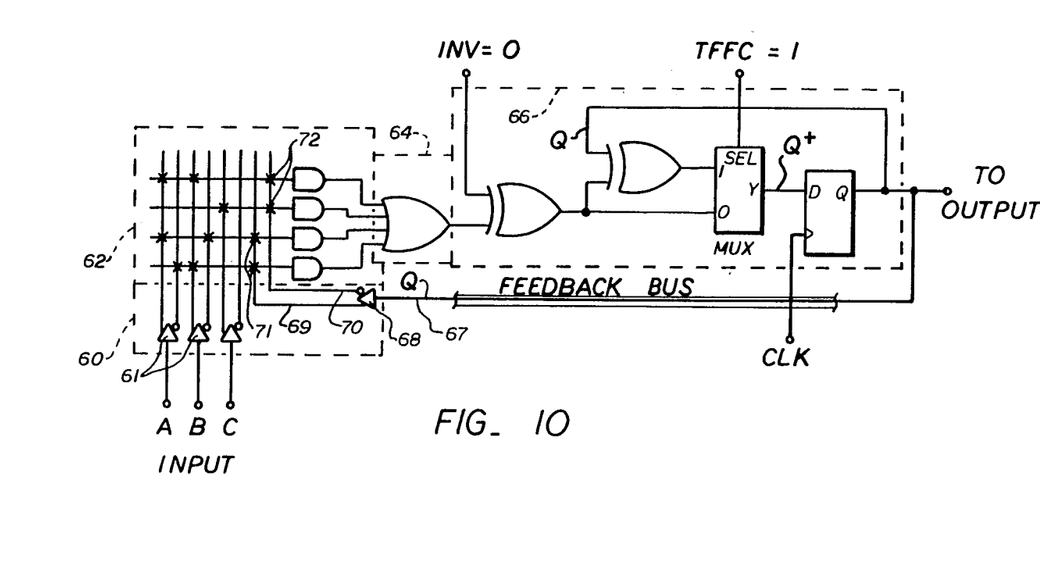
FIG. 10 is a schematic drawing representing one possible implemenation of a programmable logic device incorporating the present invention.

In FIG. 10, a schematic implementation of a programmable logic array is shown including a storage element and associated feedback connections in accordance with the present invention. As depicted, the array includes a collection of input circuits shown generally at 60 with each input having a buffer 61 with inverting and non-inverting outputs routed to a standard programmable AND array 62. One such array is shown in U.S. patent application Ser. No. 607,018 filed May 3, 1984, now U.S. Pat. No. 4,617,479, and assigned to the assignee of the present invention. The outputs generated by the programmable AND array 62 are in turn input to an OR array 64 which may be either fixed or programmable as to function. The output of OR array 64 acts as one of four inputs to a programmable storage element 66 comprised of circuitry as shown in FIG. 4 (or alternatively, as shown in FIG. 5).

Note that the line 67 of the Feedback Bus is coupled to one of the input buffers as shown at 68, the output lines 69 and 70 of which are each connected to two of the AND gate lines (inputs to OR array 64) as indicated at 71 and 72, respectively. With the feedback connection thus established, storage element 66 can be caused to emulate any of the twelve different types of flip-flop configurations illustrated in FIGS. 6(a)-9(d) by selection of the inputs INV and TFFC in combination with appropriate programming of the AND array 62.

During the following discussion of operation of the present invention, reference will be made to the following Table 2 which provides the definitions for the three main inputs—INV, TFFC and the contents of the AND-OR array (62, 64) needed by the present invention in order to emulate the various types of storage elements shown in FIGS. 6(a)-9(d). This is because the functional operation of the present invention can only be described in terms of its emulation of the various standard kinds of flip-flop storage elements shown in those figures. The statements listed under the heading "Contents of AND-OR Array" are the Boolean expressions to which the AND array and possibly the or array must be programmed in order that the desired emulation may be accomplished.

TABLE 2

| Figure | Storage Element | Mode | INV | TFFC | Contents of AND-OR Array |
|---|---|---|---|---|---|
| 6(a) | D flip-flop | D | 0 | 0 | D |
| 6(b) | D' flip-flop | ND | 1 | 0 | D' |
| 7(a) | T flip-flop | T | 0 | 1 | T |
| 7(b) | T' flip-flop | NT | 1 | 1 | T' |
| 8(a) | JK flip-flop | T | 0 | 1 | JQ'+KQ |
| 8(b) | J'K flip-flop | ND | 1 | 0 | J'Q'+KQ |
| 8(c) | JK' flip-flop | D | 0 | 0 | JQ'+K'Q |
| 8(d) | J'K' flip-flop | NT | 1 | 1 | J'Q'+K'Q |
| 9(a) | SR flip-flop | T | 0 | 1 | S+RQ |
| 9(b) | S'R flip-flop | ND | 1 | 0 | S'+RQ |
| 9(c) | SR' flip-flop | D | 0 | 0 | S+R'Q |
| 9(d) | S'R' flip-flop | NT | 1 | 1 | S'+R'Q |

Emulation of D- and T-type Flip-Flops

Figure 6A:
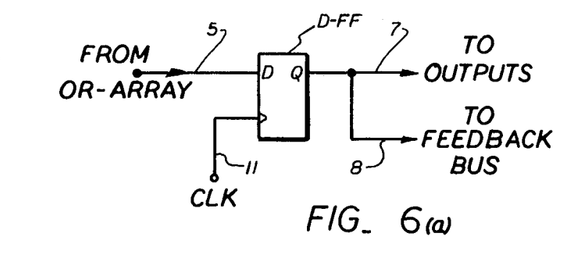
FIGS. 6(a) and 6(b) are schematic diagrams of D-type flip-flop storage elements.
Figure 6B:
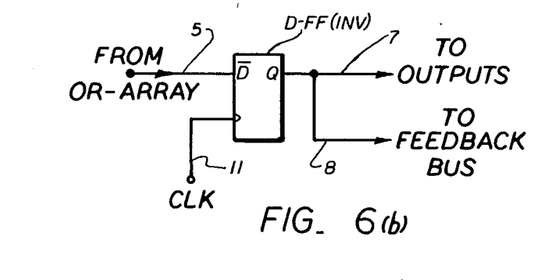
Figure 7A:
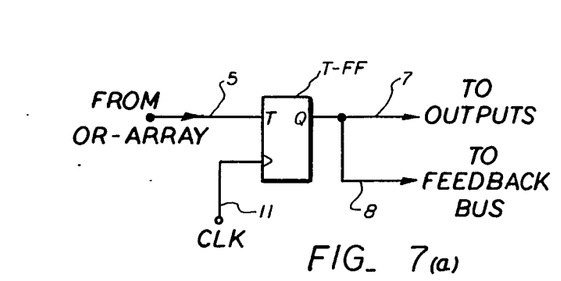
FIGS. 7(a) and 7(b) are schematic diagrams of T-type, or Toggle, flip-flop storage elements.
Figure 7B:
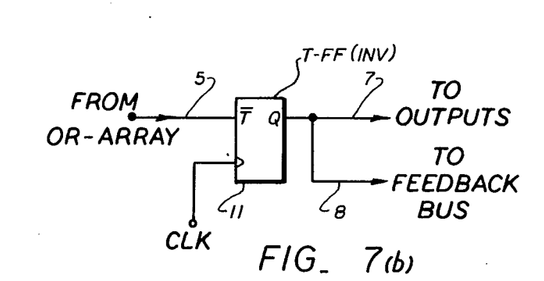
Figures 8A, 8C:
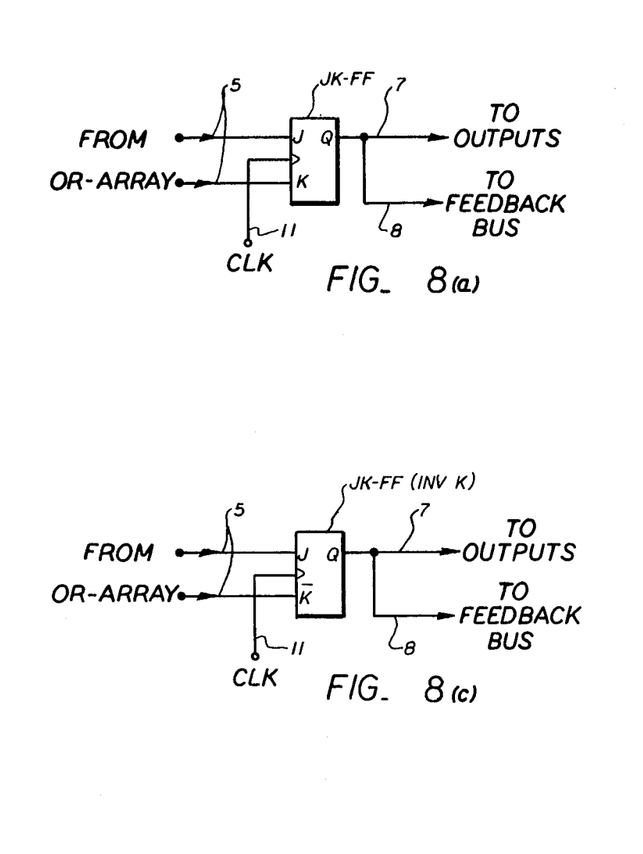
FIGS. 8(a)–8(d) are schematic diagrams of JK-type flip-flop storage elements.
Figures 8B, 8D:
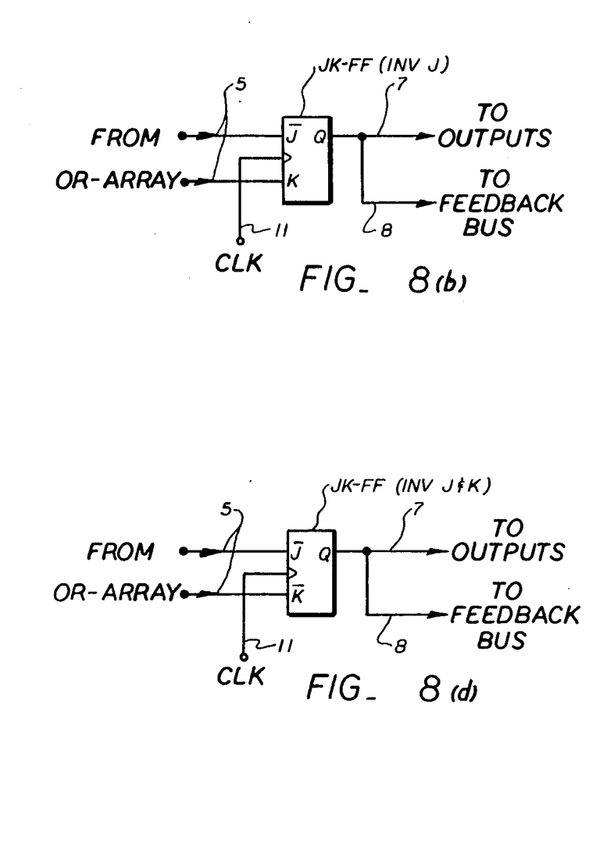
Figure 9A:
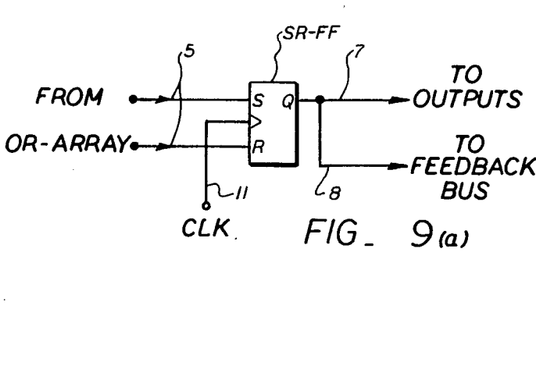
FIGS. 9(a)–9(d) are schematic diagrams of SR-type flip-flop storage elements.
Figure 9B:
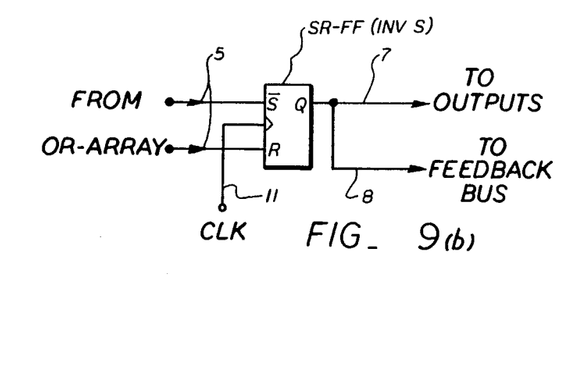
Figure 9C:
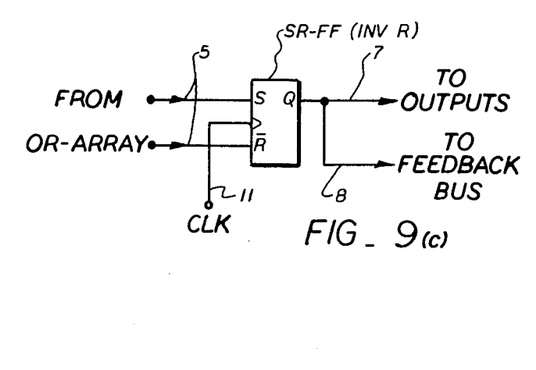
Figure 9D:
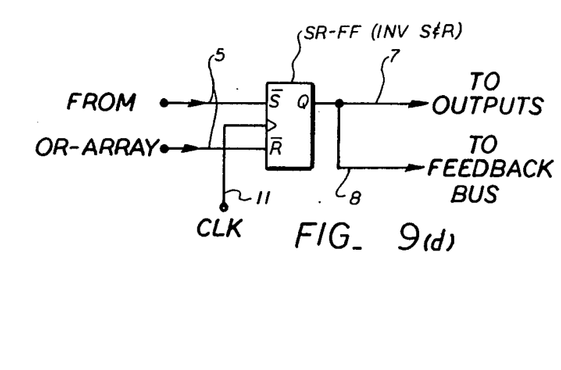

Referring now back to FIG. 4 of the drawing, it will be appreciated that the TFFC signal input on line 28 provides the controlling input which determines whether the storage element 16 will operate as a D-type or as a T-type flip-flop of a type shown in FIGS. 6(a) and 7(a). As can be seen in Table 2, when TFFC is set to 0, the multiplexer 27 outputs a signal from its Y pin which causes the storage element 16 to function as a D-type flip-flop. On the other hand, when TFFC is set to 1, multiplexer 27 outputs a signal from its Y pin which causes storage element 16 to function as a T-type flip-flop.

In both emulation situations, the INV signal on line 22 which is passed to multiplexer 27 via exclusive-OR gate 20 causes inversion of the output on line 29 if it is set to 1 and leaves the output on line 29 uninverted if it is set to 0.

The OR array or, as illustrated in FIG. 10, its input device, i.e., the AND array, collectively referred to hereinafter as the "AND-OR array" must be designed or programmed to function as a non-inverted D expression to emulate a non-inverted D-type flip-flop, as an inverted D expression to emulate an inverted D-type flip-flop and as the respective non-inverted and inverted T expressions to emulate, respectively, a non-inverted T-type flip-flop and an inverted T-type flip-flop.

Thus by manipulating the levels of the INV and TFFC signals and programming the OR array or its input correctly as shown in FIG. 10, (and as set forth in Tables 1 and 2), one can successfully cause the storage element of the present invention to function as any of the four common types of storage devices.

Emulation of JK Flip-Flops

In the ensuing discussion of the operation of the present invention in the emulation of a JK-type flip-flop, it is important to remember that it is possible to add factors to a p-term in an AND array at no additional cost of interconnection or efficiency, and that if a given signal is available as an input to a given AND array, then its inverse is available as well, this is due to the fact that inverse signals are easily generated for AND arrays by well-established conventional methods.

Programming the equation:

$$h=ABC+DEF$$

into a programmable AND array costs no more chip area than does programming the array using this equation:

$$h=ABCQ+DEFQ',$$

assuming that the Q signal is in both instances available to the AND array, i.e., via feedback.

If a requirement exists to design a JK-type flip-flop which has the following expressions associated with its inputs:

$$J=ABC+D$$

$$K=EFG$$

one can use the equation $$T=JQ'+KQ$$

and convert the equation to sum-of-products form as follows:

$$T=(ABC+D)Q'+(EFG)Q=ABCQ'+DQ'+EFGQ.$$

As can be readily seen from the above, the first set of equations defining JK inputs requires three p-terms (2 for the J input and one for the K input) and the resulting T equation also has three p-terms. This establishes that a T-type flip-flop can efficiently emulate a JK-type flip-flop. (In fact, it can be demonstrated that if the J expression has n p-terms and the K expression has m p-terms, the resulting T expression will always have m+n or fewer p-terms.)

Turning to FIG. 10, and with reference to Table 1, it can be seen that, in operation, the present invention will efficiently emulate a JK-type flip-flop of the types shown in FIGS. 8(a), 8(b), 8(c) and 8(d) when the INV and TFFC signals are set appropriately and the AND-OR array is programmed correctly. For example, to emulate a non-inverted JK-type flip-flop, the INV signal is set to zero, the TFFC signal is set to one and the AND-OR array is programmed as JQ'+KQ. Other emulations of JK-type flip-flops are implemented similarly and in accordance with FIG. 10 and Table 2.

Interestingly, it is possible with the present invention to achieve even greater efficiency of emulation of a JK-type flip-flop where K is an expression which can be expressed using fewer p-terms in its inverted form. For example, if J and K terms are as follows:

$$J=ABC+D,$$

and $$K=E'+F+G',$$

five p-terms are required in the circuit. But if K can be expressed in inverted form as $$K'=EFG,$$

the K is reduced to 1 p-term and the total requirement to three p-terms.

The equation which permits a D-type flip-flop to emulate a JK-type flip-flop has K expressed in its inverted form, as shown:

$$D=JQ'+K'Q.$$

It follows, then, that the present invention can use a D-type flip-flop emulation to emulate a JK-type flip-flop where an inversion of the K term is more efficient than a non-inverted K term as follows:

$$D = JQ' + K'Q = (ABC+D)Q' + (EFG)'Q$$
$$= (ABC+D)Q' + EFGQ = ABCQ' + DQ' + EFGQ.$$

The final resulting equation has three p-terms, which means that this emulation efficiently emulates a JK-type flip-flop with an inverted K input. This emulation results in a storage device such as that shown in FIG. 8(c). It requires only (see Table 2) that the INV and TFFC signals be cleared to zero and that the AND-OR array be programmed to $JQ' + K'Q$.

Emulating SR-Type Flip-Flops

The emulation of SR-type flip-flops using the present invention can be easily deduced from an examination of FIGS. 9(a), 9(b), 9(c) and 9(d), along with Table 2. Since the logic sequences and formulas involved here are virtually identical to those described above in discussing the emulation of JK-type flip-flops, and since the underlying logic formulas are well known in the art, a detailed discussion of this implementation and emulation is not deemed necessary here.

Alternate Embodiment

As explained above, FIG. 5 presents an alternate means of embodying the same logic and design features, emulation patterns and operational methods described above relative to FIG. 4. The major difference between the two implementations is that the multiplexer 27 in FIG. 4, the preferred embodiment, is replaced in FIG. 5 by an exclusive-NOR gate 89 and a NAND gate 47. In fact, these two gates may both be replaced by non-inverting gates (exclusive-OR and AND gates) and the operation of the circuit will remain identical.

The setting of the INV and TFFC signals, and the programming of the AND array, are identical for the circuit shown in FIG. 5 as for that shown in FIG. 4; therefore, the values of Table 2 remain valid for the alternate embodiment of the present invention shown in FIG. 5.

Implementation

One possible implementation of the present invention which takes advantage of other recent developments in programmable logic circuit design is that shown in FIG. 10 wherein the programmable storage element 66 receives one of its three significant inputs from an OR array 64 that may be either a fixed OR array or a programmable OR array. In either case, the OR array 64 is connected to a programmable AND array 62 so that the outputs of the AND array become the inputs to the OR array. This method of providing flexibility in programmable logic circuit designs is further explained and taught in detail in the aforementioned U.S. patent application Ser. No. 607,018.

Although the present invention has been described in terms of specific embodiments, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. In a programmable logic array device including a programmable AND array which responds to input data signals and develops predetermined product terms, an OR array responsive to the said product terms and operative to develop corresponding logic signals, and logic storage means for temporarily storing said logic signals and either outputting them to output terminals or returning them to said AND array, an improved logic storage means comprising:
    flip-flop means having first terminal means for receiving a next state logic signal, second terminal means for receiving a clock signal, and output terminal means; and
    control logic circuit means having third terminal means coupled to said output terminal means for receiving a feedback signal, fourth terminal means for receiving an invert control signal, fifth terminal means for receiving a toggle control signal, sixth terminal means connected to said first terminal means, and input terminal means for receiving logic signals from said OR array, said control logic circuit means being responsive to said feedback signal, said invert control signal and said toggle control signal, and operative to develop on said sixth terminal means a signal having a predetermined relationship to the logic signal input on said input terminal means, whereby said flip-flop means and said control logic circuit means may be selectively caused to emulate particular types of flip-flop means determined at least in part by said invert control signal and said toggle control signal.

2. In a programmable logic array device as recited in claim 1 wherein said flip-flop means is a D-type flip-flop and wherein said control logic circuit means includes a first exclusive-OR gate having one input connected to said fourth terminal means and another input connected to said input terminal means, a second exclusive-OR gate having one input coupled to the output of said first exclusive OR gate and another input coupled to said third terminal means, and a multiplexer having a first input coupled to said fifth terminal means, a second input coupled to the output of said first exclusive-OR gate, a third input coupled to the output of said second exclusive-OR gate and an output forming said sixth terminal means.

3. In a programmable logic array device as recited in claim 1 wherein said flip-flop means is a D-type flip-flop and wherein said control logic circuit means includes a NAND gate having one input coupled to said third terminal means and another input coupled to said fifth terminal means, an exclusive-NOR gate having one input coupled to the output of said NAND gate and another input coupled to said fourth terminal means, and an exclusive-OR gate having one input coupled to the output of said exclusive-NOR gate and another input coupled to said input terminal means, the output thereof forming said sixth terminal means.

4. In a programmable logic array device as recited in claim 1 wherein said logic storage means is a T-type flip-flop.

5. A programmable logic array device comprising:
    programmable AND array means which responds to input data signals and develops predetermined product terms;
    OR array means responsive to the said product terms and operative to develop corresponding logic signals, and logic storage means for temporarily storing said logic signals and either outputting them to output terminals or returning them to said AND array, said logic storage means including:
  flip-flop means having first terminal means for receiving a next state logic signal, second terminal means for receiving a clock signal, and output terminal means; and
  control logic circuit means having third terminal means coupled to said output terminal means for receiving a feedback signal, fourth terminal means for receiving an invert control signal, fifth terminal means for receiving a toggle control signal, sixth terminal means connected to said first terminal means, and input terminal means for receiving logic signals from said OR array, said control logic circuit means being responsive to said feedback signal, said invert control signal and said toggle control signal, and operative to develop on said sixth terminal means a signal having a predetermined relationship to the logic signal input on said input terminal means, whereby said flip-flop means and said control logic circuit means may be selectively caused to emulate particular types of flip-flop means determined at least in part by said invert control signal and said toggle control signal.

6. A programmable logic array device as recited in claim 5 wherein said flip-flop means is a D-type flip-flop and wherein said control logic circuit means includes a first exclusive-OR gate having one input connected to said fourth terminal means and another input connected to said input terminal means, a second exclusive-OR gate having one input coupled to the output of said first exclusive OR gate and another input coupled to said third terminal means, and a multiplexer having a first input coupled to said fifth terminal means, a second input coupled to the output of said first exclusive-OR gate, a third input coupled to the output of said second exclusive-OR gate and an output forming said sixth terminal means.

7. A programmable logic array device as recited in claim 5 wherein said flip-flop means is a D-type flip-flop and wherein said control logic circuit means includes a NAND gate having one input coupled to said third terminal means and another input coupled to said fifth terminal means, an exclusive-NOR gate having one input coupled to the output of said NAND gate and another input coupled to said fourth terminal means, and an exclusive-OR gate having one input coupled to the output of said exclusive-NOR gate and another input coupled to said input terminal means, the output thereof forming said sixth terminal means.

8. A programmable logic array device as recited in claim 5 wherein said logic storage means is a T-type flip-flop.

9. In a programmable logic array device including a programmable AND array which responds to input data signals and develops corresponding product term signals, an OR array which is responsive to said product term signals and is operative to develop a corresponding SUMTERM signal at its output, and logic storage means for receiving and temporarily storing said SUMTERM signal and for presently outputting a present state logic signal Q having a predetermined logical relationship to a previously input SUMTERM signal, and for subsequently outputting a next state logic signal Q+, an improved logic storage means comprising:

flip-flop means having first terminal means for receiving a next state logic signal Q+, second terminal means for receiving a clock signal, and output terminal means for developing a present state output signal Q; and programmable control circuit means responsive to said SUMTERM signal and said present state logic signal Q and operative to develop a next state logic signal Q+, in accordance with one of the following tables selected from the group consisting of

TABLE A

| SUMTERM | Q | Q+ |
|---|---|---|
| 0 | 0 | 0 |
| 0 | 1 | 0 |
| 1 | 0 | 1 |
| 1 | 1 | 1, |

TABLE B

| SUMTERM | Q | Q+ |
|---|---|---|
| 0 | 0 | 1 |
| 0 | 1 | 1 |
| 1 | 0 | 0 |
| 1 | 1 | 0, |

TABLE C

| SUMTERM | Q | Q+ |
|---|---|---|
| 0 | 0 | 0 |
| 0 | 1 | 1 |
| 1 | 0 | 1 |
| 1 | 1 | 0, and |

TABLE D

| SUMTERM | Q | Q+ |
|---|---|---|
| 0 | 0 | 1 |
| 0 | 1 | 0 |
| 1 | 0 | 0 |
| 1 | 1 | 1. |

10. In a programmable logic array device as recited in claim 9 wherein said programmable control circuit means includes an exclusive OR gate having a first input coupled to the output of said OR array, a second input coupled to said output terminal means, and an output coupled to said first terminal means.

11. In a programmable logic array device as recited in claim 10 wherein said second input is coupled to said output terminal means through at least one programmable logic device.

12. In a programmable logic array device as recited in claim 10 wherein said second input is coupled to said output terminal means through a first programmable logic device and a second programmable logic device.

13. In a programmable logic array device as recited in claim 12 wherein said first programmable logic device includes a NAND gate having one input coupled to said output terminal means, and another input for receiving a toggle control signal.

14. In a programmable logic array device as recited in claim 13 wherein said second programmable logic device includes an exclusive NOR gate having one input coupled to the output of said NAND gate, another input for receiving an invert control signal, and an output coupled to said second input of said exclusive OR gate.

15. In a programmable logic array device as recited in claim 9 wherein said programmable control circuit means includes:

a first exclusive OR gate having one input coupled to the output of said OR array, and another input for receiving an invert control signal;

a second exclusive OR gate having one input coupled to said output terminal, and another input coupled to the output of said first exclusive OR gate; and a multiplexer means having a first input coupled to the output of said first exclusive OR gate, a second input coupled to the output of said second exclusive OR gate, a control input for receiving a toggle control signal, and an output coupled to said first terminal means.

* * * * *